US012787899B2

(12) United States Patent
Mun et al.

(10) Patent No.: US 12,787,899 B2
(45) Date of Patent: Nov. 3, 2026

(54) SEMICONDUCTOR PACKAGE

(71) Applicant: Samsung Electronics Co., Ltd., Suwon-si (KR)

(72) Inventors: Kyungdon Mun, Suwon-si (KR); Jihwang Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 210 days.

(21) Appl. No.: 18/747,822

(22) Filed: Jun. 19, 2024

(65) Prior Publication Data

US 2025/0201763 A1 Jun. 19, 2025

(30) Foreign Application Priority Data

Dec. 18, 2023 (KR) .................. KR10-2023-0184802

(51) Int. Cl.
*H10W 90/00* (2026.01)
*H10W 70/05* (2026.01)
(Continued)

(52) U.S. Cl.
CPC ....... *H10W 90/701* (2026.01); *H10W 70/685* (2026.01); *H10W 72/50* (2026.01);
(Continued)

(58) Field of Classification Search
CPC . H10W 90/701; H10W 70/685; H10W 72/50; H10W 74/111; H10W 70/093; H10W 70/60; H10W 90/724; H10W 70/614; H10W 74/117; H10W 70/652; H10W 72/90; H10W 74/124;
(Continued)

(56) References Cited

U.S. PATENT DOCUMENTS 10,332,856 B2 6/2019 Chen et al.
10,510,704 B2 12/2019 Chen et al.
(Continued)

*Primary Examiner* — J.E. Schoenholtz
(74) *Attorney, Agent, or Firm* — Muir Patent Law, PLLC

(57) ABSTRACT

A semiconductor package includes a molded layer covering at least a portion of a chip structure and including a plurality of hollows in an upper surface thereof, an upper redistribution structure disposed on the molded layer and including a plurality of insulating layers and a plurality of upper redistribution layers respectively disposed on the plurality of insulating layers, and a plurality of posts penetrating through the molded layer and electrically connecting the lower redistribution layer to the plurality of upper redistribution layers, wherein the plurality of insulating layers include a first insulating layer between the first upper redistribution layer and the molded layer, and the first insulating layer includes a first sub-layer covering the upper surface of the molded layer and an upper surface of each of the plurality of posts and including protruding portions filling the plurality of hollows and openings exposing at least a portion of the upper surface of each of the plurality of posts, and a second sub-layer covering the first sub-layer and filling the openings, wherein a first height from the upper surface of the molded layer to an upper surface of the first sub-layer is less than a second height from the upper surface of the first sub-layer to an upper surface of the second sub-layer.

20 Claims, 15 Drawing Sheets

(51) Int. Cl.

| | |
|---|---|
| ***H10W 70/60*** | (2026.01) |
| ***H10W 70/685*** | (2026.01) |
| ***H10W 72/50*** | (2026.01) |
| ***H10W 74/10*** | (2026.01) |

(52) U.S. Cl.

CPC ........ *H10W 74/111* (2026.01); *H10W 70/093* (2026.01); *H10W 70/60* (2026.01); *H10W 90/724* (2026.01)

(58) Field of Classification Search

CPC ... H10W 70/65; H10W 74/114; H10W 90/00; H10W 90/722; H10P 72/74; H10P 72/7424

See application file for complete search history.

(56) References Cited

U.S. PATENT DOCUMENTS

| | | | | |
|---|---|---|---|---|
| 10,522,436 | B2 | 12/2019 | Yu et al. | |
| 11,075,131 | B2 * | 7/2021 | Tsai | H10P 72/74 |
| 11,404,342 | B2 | 8/2022 | Chen et al. | |
| 11,574,872 | B2 | 2/2023 | Lin et al. | |
| 11,676,927 | B2 * | 6/2023 | Mun | H10P 72/74<br>257/668 |
| 12,506,102 | B2 * | 12/2025 | Sandstrom | H10W 90/00 |
| 2015/0155203 | A1 | 6/2015 | Chen et al. | |
| 2017/0141053 | A1 | 5/2017 | Chen et al. | |
| 2018/0082964 | A1 * | 3/2018 | Wu | H10W 20/20 |
| 2018/0130761 | A1 * | 5/2018 | Kim | H03F 3/21 |
| 2019/0206824 | A1 * | 7/2019 | Lu | H10P 72/74 |
| 2021/0335729 | A1 * | 10/2021 | Lu | H10P 72/74 |

* cited by examiner

SEMICONDUCTOR PACKAGE

CROSS-REFERENCE TO RELATED APPLICATION

This application claims benefit of priority to Korean Patent Application No. 10-2023-0184802 filed on Dec. 18, 2023 in the Korean Intellectual Property Office, the disclosure of which is incorporated herein by reference in its entirety.

BACKGROUND

Aspects of the present inventive concept relate to a semiconductor package.

As electronic devices have become lighter and have been implemented with higher degrees of performance, there is a demand for the development of semiconductor packages reduced in size and having high performance in the semiconductor package field. Accordingly, a package-on-package (POP) structure in which a plurality of semiconductor packages are stacked vertically using a plurality of posts and an upper redistribution structure has been developed.

SUMMARY

An aspect of the present inventive concept is to provide a semiconductor package having improved reliability.

According to an aspect of the present inventive concept, a semiconductor package may include a lower redistribution structure including a lower redistribution layer, a chip on the lower redistribution structure, a molded layer covering at least a portion of the chip and including a plurality of hollows in an upper surface of the molded layer, an upper redistribution structure on the molded layer and including a plurality of insulating layers and a plurality of upper redistribution layers respectively disposed on the plurality of insulating layers, a plurality of posts penetrating through the molded layer and electrically connecting the lower redistribution layer to the plurality of upper redistribution layers, and external connection bumps below the lower redistribution structure and electrically connected to the lower redistribution layer, wherein the plurality of upper redistribution layers include a first upper redistribution layer closest to the upper surface of the molded layer, the plurality of insulating layers include a first insulating layer between the first upper redistribution layer and the molded layer, the first insulating layer includes a first sub-layer covering the upper surface of the molded layer and an upper surface of each of the plurality of posts, the first sub-layer including protruding portions filling the plurality of hollows and openings exposing at least a portion of the upper surface of each of the plurality of posts, and a second sub-layer covering the first sub-layer and filling the openings, and wherein a first height from the upper surface of the molded layer to an upper surface of the first sub-layer is less than a second height from the upper surface of the first sub-layer to an upper surface of the second sub-layer.

According to an aspect of the present inventive concept, a semiconductor package may include a lower redistribution structure including a lower redistribution layer, a chip on the lower redistribution structure, a molded layer covering at least a portion of the chip and including a plurality of hollows in an upper surface of the molded layer, an upper redistribution structure on the molded layer and including a plurality of insulating layers and a plurality of upper redistribution layers respectively disposed on the plurality of insulating layers, and a plurality of posts penetrating through the molded layer and electrically connecting the lower redistribution layer to the plurality of upper redistribution layers, wherein a lowest insulating layer among the plurality of insulating layers includes a first sub-layer filling the plurality of hollows and including openings exposing at least a portion of each of the plurality of posts, and a second sub-layer filling the openings and a space between a lowermost upper redistribution layer among the plurality of upper redistribution layers and the first sub-layer.

According to an aspect of the present inventive concept, a semiconductor package may include a lower redistribution structure including a lower redistribution layer, a chip on the lower redistribution structure, a molded layer covering at least a portion of the chip and including a plurality of hollows in an upper surface of the mold layer, an upper redistribution structure on the molded layer and including a plurality of insulating layers and a plurality of upper redistribution layers respectively disposed on the plurality of insulating layers, and a plurality of posts penetrating through the molded layer and electrically connecting the lower redistribution layer to the plurality of upper redistribution layers, wherein a lowest insulating layer among the plurality of insulating layers includes a first sub-layer having a lower surface in contact with the upper surface of the molded layer and on which protruding portions filling the plurality of hollows are arranged and an upper surface located to oppose the lower surface, the upper surface being flat, and a second sub-layer having a lower surface in contact with the upper surface of the first sub-layer and an upper surface on which a lowermost upper redistribution layer among the plurality of upper redistribution layers is disposed.

According to an aspect of the present inventive concept, a method of making a semiconductor package may include forming a lower redistribution structure on a carrier substrate; providing a chip and a plurality of posts on the lower redistribution structure; forming a molded layer covering the chip and the plurality of posts; planarizing the molded layer to expose upper surfaces of the plurality of posts, wherein the planarization process causes a plurality of hollows to form in an upper surface of the molded layer; and forming a first insulating layer of an upper redistribution structure on the upper surface of the molded layer, wherein the forming the first insulating layer includes: forming a preliminary sub-layer covering the upper surface of the molded layer and an upper surface of each of the plurality of posts, the preliminary sub-layer including protruding portions filling the plurality of hollows; cutting an upper surface of the preliminary sub-layer to form a first sub-layer having a flat upper surface; and forming a second sub-layer covering the first sub-layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the attached drawings. Unless otherwise specified, in this specification, terms, such as 'upper portion,' 'upper surface,' 'lower portion,' 'lower surface,' 'side surface,' etc. are based on the drawings, and the directions in which components are actually arranged may vary.

In addition, ordinal numbers, such as "first", "second", "third", etc. may be used as labels for specific elements, steps, directions, etc. to distinguish various elements, steps, directions, etc. from each other. Terms that are not described using "first," "second," etc. in the specification may still be referred to as "first" or "second" in the claims. In addition, terms referenced by a particular ordinal number (e.g., "first" in a particular claim) may be described elsewhere with a different ordinal number (e.g., "second" in the specification or other claims).

Figure 1A:
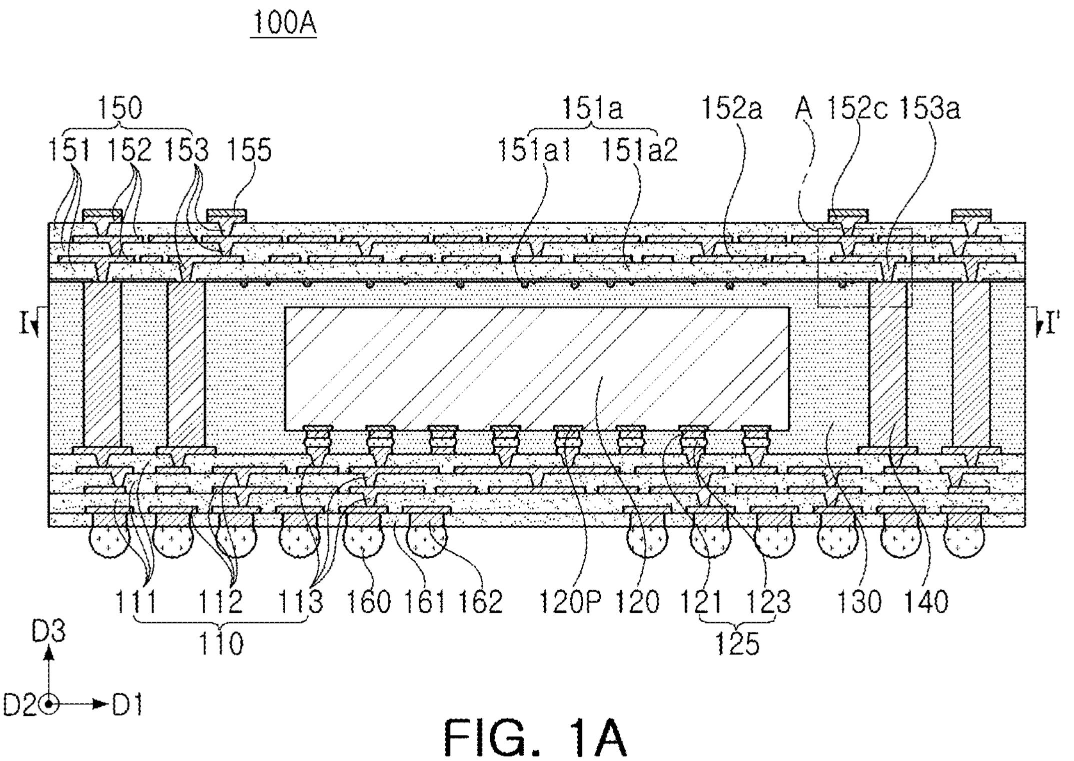
FIG. 1A is a cross-sectional view of a semiconductor package according to an embodiment.
Figure 1B:
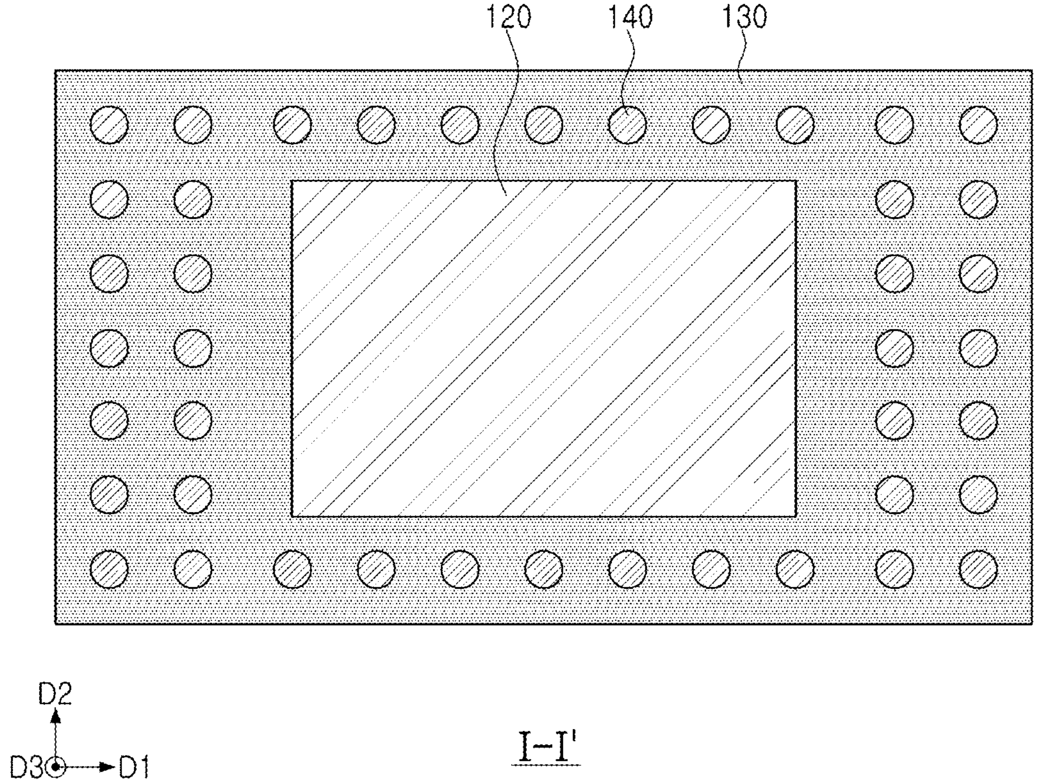
FIG. 1B is a plan view taken along line I-I' of FIG. 1A.
Figure 1C:
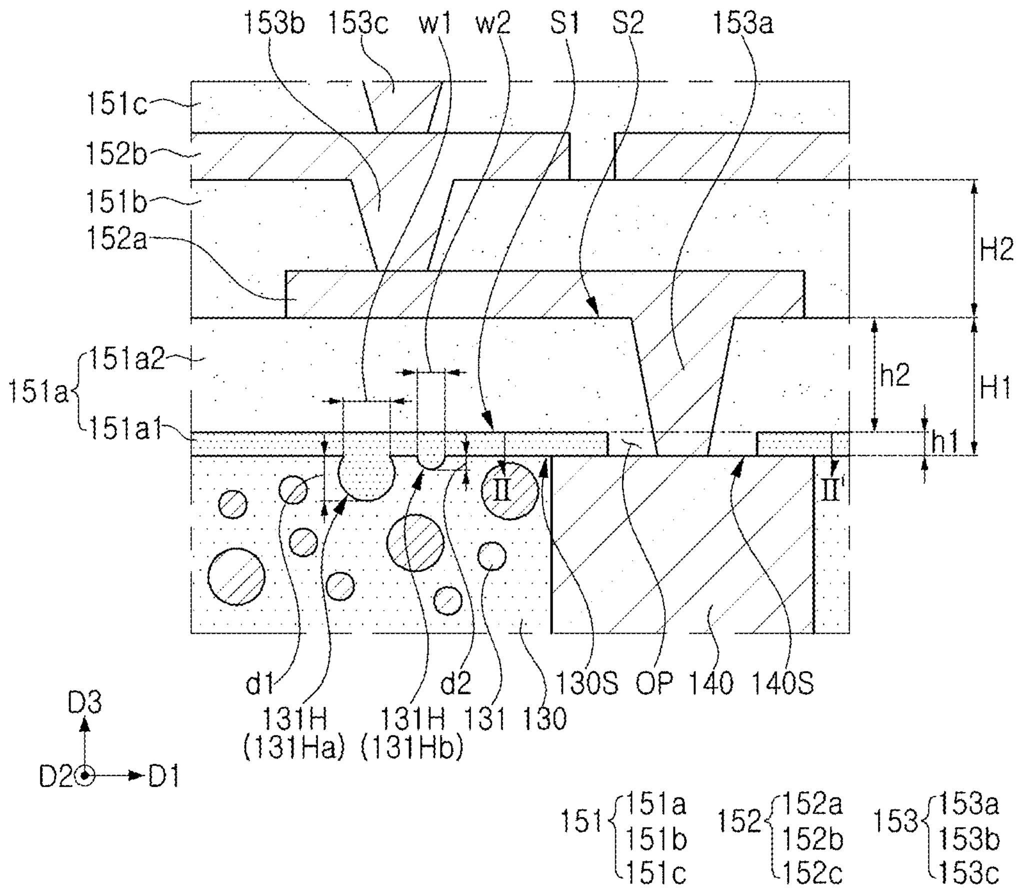
FIG. 1C is a partially enlarged view of region 'A' of FIG. 1A.
Figure 1D:
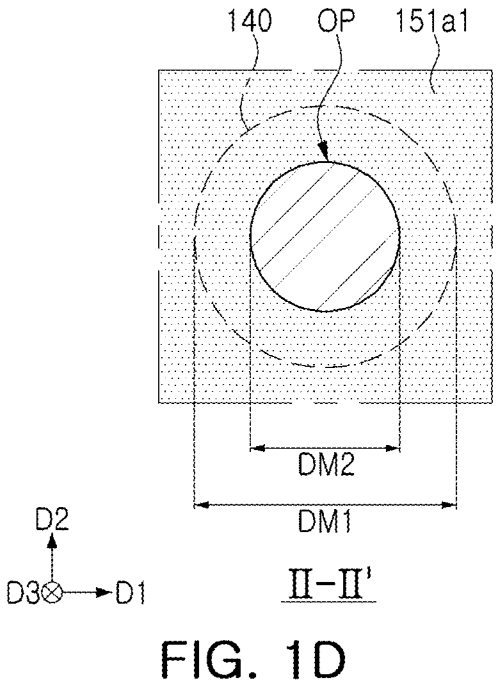
FIG. 1D is a plan view, taken along line II-II' of FIG. 1C.

FIG. 1A is a cross-sectional view of a semiconductor package according to an embodiment, FIG. 1B is a plan view taken along line I-I' of FIG. 1A, FIG. 1C is a partially enlarged view of region 'A' of FIG. 1A, and FIG. 1D is a plan view, taken along line II-II' of FIG. 1C.

Referring to FIGS. 1A to 1D, a semiconductor package 100A of an embodiment may include a lower redistribution structure 110, a chip structure 120 (e.g., a chip), a molded layer 130, a plurality of posts 140, and an upper redistribution structure 150. According to an embodiment, the semiconductor package 100A may further include external connection bumps 160.

The lower redistribution structure 110 is a support substrate on which the chip structure 120 is mounted, and may include a lower insulating layer 111, lower redistribution layers 112, and lower redistribution vias 113.

The lower insulating layer 111 may be formed of or include an insulating resin. The insulating resin may include a thermosetting resin, such as an epoxy resin, a thermoplastic resin, such as polyimide, or a resin obtained by impregnating these resins with an inorganic filler, etc., such as prepreg, Ajinomoto build-up film (ABF), FR-4, bismaleimide-triazine (BT). For example, the lower insulating layer 111 may include a photosensitive resin, such as photoimageable dielectric (PID). The lower insulating layer 111 may include a plurality of insulating layers stacked in a vertical direction D3. Depending on the process, the boundaries between the plurality of insulating layers may be inapparent.

The lower redistribution layer 112 may be disposed on and within the lower insulating layer 111 and may redistribute a connection terminal 120P of the chip structure 120. The lower redistribution layer 112 may be formed of or include metals, for example, copper (Cu), aluminum (Al), silver (Ag), tin (Sn), gold (Au), nickel (Ni), lead (Pb), and titanium (Ti), or alloys thereof. The lower redistribution layer 112 may perform various functions depending on the design. For example, the lower redistribution layer 112 may include a ground pattern, a power pattern, and a signal pattern. Here, the signal pattern may be defined as a transmission path for various signals, such as data signals, excluding a ground pattern, power pattern, and the like. The lower redistribution layer 112 may include more or fewer redistribution layers than those illustrated in the drawing. The lower redistribution layer 112 may include pads in contact with the connection bumps 125 and the plurality of posts 140.

The lower redistribution via 113 may extend from within the lower insulating layer 111 and be electrically connected to the lower redistribution layer 112. For example, the lower redistribution via 113 may interconnect the lower redistribution layers 112 on different levels. The lower redistribution via 113 may include a signal via, a ground via, and a power via. The lower redistribution via 113 may be formed of or include metal materials, for example, copper (Cu), aluminum (Al), silver (Ag), tin (Sn), gold (Au), nickel (Ni), lead (Pb), and titanium (Ti).), or alloys thereof. The lower redistribution via 113 may be a filled via formed of a metal material and filling a via hole or a conformal via formed of a metal material and extending along an inner wall of a via hole.

The external connection bumps 160 may be disposed below the lower redistribution structure 110. The external connection bumps 160 may be electrically connected to the lower redistribution layer 112. The semiconductor package 100A may be connected to an external device, such as a module substrate or system board, through the external connection bumps 160. The external connection bumps 160 may be formed of or include a low melting point metal, for example, tin (Sn) or an alloy containing tin (Sn) (e.g., Sn—Ag—Cu). According to an embodiment, the external connection bumps 160 may be formed as a combination of a pillar and a ball.

According to an embodiment, an underbump metal 162 and a lower protective layer 161 may be disposed between the external connection bumps 160 and the lower redistribution layer 112. The underbump metal 162 may be formed of or include metal materials including, for example, copper (Cu), aluminum (Al), silver (Ag), tin (Sn), gold (Au), nickel (Ni), lead (Pb), and titanium (Ti), or alloys thereof. The lower protective layer 161 may be formed of or include the same material as that of the lower insulating layer 111, for example, PID, but is not limited thereto.

The chip structure 120 may be disposed on the lower redistribution structure 110 and include connection terminals 120P electrically connected to the lower redistribution layer 112. The connection terminals 120P may be electrically connected to the lower redistribution layer 112 through the connection bumps 125. The connection bumps 125 may include a pillar portion 121 in contact with the connection terminals 120P and a solder portion 123 disposed below the pillar portion 121. The pillar portion 121 may be formed of or include copper (Cu) or an alloy of copper (Cu), and the solder portion 123 may include a low melting point metal, such as tin (Sn) or an alloy containing tin (Sn). According to an embodiment, the connection bumps 125 may include only one of the pillar portion 121 and the solder portion 123. According to an embodiment, an underfill layer may be disposed between the chip structure 120 and the lower redistribution structure 110. The underfill layer may have a capillary underfill (CUF) structure, but is not limited thereto. The underfill layer may have a molded underfill (MUF) structure integrated with the molded layer 130.

The chip structure 120 may include a semiconductor wafer formed of a semiconductor element, such as silicon and germanium, or a compound semiconductor, such as silicon carbide (SiC), gallium arsenide (GaAs), indium arsenide (InAs), and indium phosphide (InP) and an integrated circuit (IC). The chip structure 120 may be a bare semiconductor chip without a separate bump or interconnection layer, but is not limited thereto and may be a package-type semiconductor chip. The integrated circuit may be a logic circuit (or a logic chip), such as a central processing unit (CPU), a graphics processing unit (GPU), a field programmable gate array (FPGA), an application processor (AP), a digital signal processor (DSP), a cryptographic processor, a microprocessor, a microcontroller, an analog-to-digital converter (ADC), an application-specific integrated chip (ASIC) or a memory circuit (or a memory chip) including a volatile memory, such as dynamic RAM (DRAM) and static RAM (SRAM), and a nonvolatile memory, such as phase change RAM (PRAM), magnetic RAM (MRAM), and resistive RAM (RRAM), flash memory, and the like. According to an embodiment, the chip structure 120 may be a package structure including a plurality of semiconductor chips, which will be described below with reference to FIG. 6.

The molded layer 130 is disposed on the lower redistribution structure 110 and may cover at least a portion of the chip structure 120. The molded layer 130 may be formed of or include, for example, a thermosetting resin, such as epoxy resin, a thermoplastic resin, such as polyimide, prepreg, ABF, FR-4, BT, epoxy molding compound (EMC), and the like. The molded layer 130 may include fillers 131 (e.g., filler particles) dispersed in an insulating resin. The fillers 131 may be formed of or include inorganic fillers (e.g., silica particles) of various sizes, but are not limited thereto.

With reference, e.g., to FIG. 1C, the molded layer 130 may include a plurality of hollows 131H formed by removing the fillers 131 on an upper surface 130S. For example, a planarization process used to form the molded layer 130 may cause some of the fillers 131 to be exposed from the upper surface 130S of the molded layer 130. The exposed fillers 131 may be removed by the planarization process to form the plurality of hollows 131H. The upper surface 130S of the molded layer 130 and an upper surface 140S of each of the plurality of posts 140 may be coplanar. At least one of a depth in a vertical direction D3 and a width in a horizontal direction D1 of at least one of the plurality of hollows 131H may be about 10 μm or more. For example, a first cavity 131Ha may be formed by removing relatively large fillers 131, and a second cavity 131Hb may be formed by removing relatively small fillers 131. At least one of a depth d1 and a width w1 of the first cavity 131Ha may be about 10 μm or more, for example, about 10 μm to about 50 μm, about 10 μm to about 40 μm, or about 10 μm to about 30 μm, but is not limited thereto. At least one of a depth d2 and a width w2 of the second cavity 131Hb may be less than about 10 μm. In example embodiments, by introducing a sub-layer filling the hollows (e.g., 131Ha) that may cause undulation, hole defects, and the like of the upper insulating layer 151 and the upper redistribution layer 152 in a subsequent process, the yield and reliability of the semiconductor package may be improved.

The plurality of posts 140 may be disposed around the chip structure 120 and may penetrate through the molded layer 130 to electrically connect the lower redistribution layer 112 to the upper redistribution layer 152. The plurality of posts 140 may be formed of or include copper (Cu), nickel (Ni), titanium (Ti), lead (Pb), aluminum (Al), silver (Ag), gold (Au), platinum (Pt), or alloys thereof. The plurality of posts 140 may extend in the vertical direction D3 within the molded layer 130. The plurality of posts 140 may have a cylindrical shape, but are not limited thereto.

As used herein, an item, layer, or portion of an item or layer described as "extending" or as extending "lengthwise" in a particular direction has a length in the particular direction and a width perpendicular to that direction, where the length is greater than the width.

The upper redistribution structure 150 may be disposed on the molded layer 130 and may include an upper insulating layer 151, an upper redistribution layer 152, and an upper redistribution via 153. Hereinafter, in this specification, the upper insulating layer 151 may be referred to as 'a plurality of insulating layers,' and the upper redistribution via 153 may be referred to as an 'upper via'.

The upper insulating layer 151 may be formed of or include a thermosetting resin, such as an epoxy resin, a thermoplastic resin, such as polyimide, or a resin obtained by impregnating these resins with an inorganic filler, etc., such as prepreg, ABF, FR-4, BT. For example, the upper insulating layer 151 may include a photosensitive resin, such as PID. The upper insulating layer 151 may include a plurality of insulating layers stacked in the vertical direction D3. The upper insulating layer 151 may include more or fewer insulating layers than those illustrated in the drawing. Depending on the process, the boundaries between each of the plurality of insulating layers may be non-apparent. For example, the plurality of insulating layers 151 may include a first insulating layer 151*a*, a second insulating layer 151*b*, and a third insulating layer 151*b* that are sequentially stacked.

The upper redistribution layer 152 may be disposed on and within the upper insulating layer 151. The upper redistribution layer 152 may be formed of or include metals, for example, copper (Cu), aluminum (Al), silver (Ag), tin (Sn), gold (Au), nickel (Ni), lead (Pb), and titanium (Ti), or alloys thereof. The upper redistribution layer 152 may include a ground pattern, a power pattern, and a signal pattern depending on the design. The upper redistribution layer 152 may include more or fewer redistribution layers than those illustrated in the drawing. For example, the plurality of upper redistribution layers 152 may include a first upper redistribution layer 152*a*, a second upper redistribution layer 152*b*, and a third upper redistribution layer 152*c* that are sequentially stacked. According to an embodiment, a barrier layer 155 may be disposed on a pad portion of the uppermost upper redistribution layer (e.g., the third upper redistribution layer 152*c*). The barrier layer 155 may be formed of or include a material that is resistant to oxidation, for example, nickel (Ni), gold (Au), or alloys thereof.

The upper redistribution via 153 may extend within the upper insulating layer 151 and be electrically connected to the upper redistribution layer 152. The upper redistribution via 153 may interconnect the upper redistribution layers 152 on different levels. For example, the plurality of upper vias 153 may include a first upper via 153*a*, a second upper via 153*b*, and a third upper via 153*c* penetrating through the first to third insulating layers 151*a*, 151*b*, and 151*c*, respectively. The upper redistribution via 153 may be formed of or include metal materials, for example, copper (Cu), aluminum (Al), silver (Ag), tin (Sn), gold (Au), nickel (Ni), lead (Pb), and titanium (Ti), or alloys thereof. The upper redistribution via 153 may be a filled via formed of a metal material and filling a via hole or a conformal via formed of a metal material and extending along an inner wall of a via hole.

The lowermost upper redistribution layer 152*a* may be electrically connected to a corresponding one of the plurality of posts 140 through the lowermost upper via 153*a*. The lowermost upper via 153*a* (or referred to as 'first upper via') may penetrate through a portion of the second sub-layer 151*a*2 filling openings OP of a first sub-layer 151*a*1. The lowermost upper via 153*a* may contact the upper surface 140S of the post 140 exposed through the openings OP.

In example embodiments, the lowest insulating layer 151*a* (or referred to as a 'first insulating layer') among the plurality of insulating layers 151 may include the first sub-layer 151*a*1 and the second sub-layer 151*a*2. The first sub-layer 151*a*1 and the second sub-layer 151*a*2 may include the same insulating material, for example, PID, but are not limited thereto. Here, the lowermost insulating layer 151*a* may be defined as the upper insulating layer 151 between the lowermost upper redistribution layer 152*a* (or referred to as a 'first upper redistribution layer') and the molded layer 130. The lowermost upper redistribution layer 152*a* may be defined as the upper redistribution layer 152 closest to the upper surface 130S of the molded layer 130 among the plurality of upper redistribution layers 152. According to example embodiments, since the first sub-layer 151*a*1 is introduced into the lowermost insulating layer 151*a*, defects caused by the hollows 131H of the molded layer 130 may be prevented and the reliability of the semiconductor package may be improved.

The first sub-layer 151*a*1 may cover the upper surface 130S of the molded layer 130 and at least a portion of an upper surface 140S of each of the plurality of posts 140. The first sub-layer 151*a*1 may fill the hollows 131H of the molded layer 130 and include openings OP exposing at least a portion of the upper surface 140S of each of the plurality of posts 140. A lower surface of the first sub-layer 151*a*1 may be in contact with the upper surface 130S of the molded layer 130, and convex portions (e.g., protruding portions) filling the plurality of hollows 131H may be disposed on the lower surface of the first sub-layer 151*a*1. The upper surface S1 of the first sub-layer 151*a*1 may be a flat surface to which a grinding process has been applied.

The second sub-layer 151*a*2 may cover the first sub-layer 151*a*1. The second sub-layer 151*a*2 may fill a space between the lowermost upper redistribution layer 152*a* and the first sub-layer 151*a*1 and the openings OP of the first sub-layer 151*a*1. A lower surface of the second sub-layer 151*a*2 may be in contact with the upper surface of the first sub-layer 151*a*1. The lowermost upper redistribution layer 152*a* may be disposed on an upper surface S2 of the second sub-layer 151*a*2.

A first height h1 from the upper surface 130S of the molded layer 130 to the upper surface S1 of the first sub-layer 151*a*1 may be less than a second height h2 from the upper surface S1 of the first sub-layer 151*a*1 to the upper surface S2 of the second sub-layer 151*a*2. The first height h1 may be about 40% or less of the second height h2, for example, about 10% to about 40%, about 15% to about 35%, and the like. If the first height h1 exceeds about 40% of the second height h2, undulation of the second sub-layer 151*a*2 may occur near the openings OP of the first sub-layer 151*a*1, or a thickness H1 of the lowermost insulating layer 151*a* may become excessively large. For example, the second height h2 may range from about 1 μm to about 10 μm, about 2 μm to about 8 μm, about 3 μm to about 7 μm, about 4 μm to about 6 μm, and the like, but is not limited thereto. The second height h2 may vary depending on the process. Here, the first height h1 may refer to the minimum thickness of the first sub-layer 151*a*1 excluding the portions (the convex portions) filling the plurality of hollows 131H. The second height h2 may refer to the minimum thickness of the second sub-layer 151*a*2 excluding the portions filling the openings OP of the first sub-layer 151*a*1.

With reference, e.g., to FIG. 1D, a width DM2 of each of the openings OP of the first sub-layer 151*a*1 may range from about 50% or more of a width DM1 of a corresponding upper surface 140S of the plurality of posts 140, for example, about 50% to about 90%, about 60% to about 90%, about 70% to about 90%, and the like. If the width DM2 of the opening OP is less than about 50% of the width DM1 of the post 140, it may be difficult to align the lowermost upper redistribution via 153*a* to pass through the opening OP. In addition, if the width DM2 of the opening OP exceeds about 90% of the width DM1 of the post 140, it may be difficult to align the opening OP and the post 140 so that the molded layer 130 is not exposed. In an embodiment, the opening OP may be aligned with the corresponding post 140 in the vertical direction D2 so that the molded layer 130 is not exposed. Accordingly, the first sub-layer 151*a*1 may cover the interface between the molded layer 130 and the post 140, thereby preventing peeling of the molded layer 130.

In an embodiment, the first thickness H1 of the first insulating layer 151*a* may be equal to or less than a second thickness H2 of the second insulating layer 151*b*. The second insulating layer 151*b* may be defined as the upper insulating layer 151 between the first upper redistribution layer 152*a* and the second upper redistribution layer 152*b*. The second upper redistribution layer 152*b* may be disposed on an upper surface of the second insulating layer 151*b*. The first thickness H1 of the first insulating layer 151*a* may be a distance from the upper surface 130S of the molded layer 130 to the upper surface S2 of the second sub-layer 151*a*2, and the second thickness H2 of the second insulating layer 151*b* may be defined as a distance from the upper surface S2 of the second sub-layer 151*a*2 to the upper surface of the second insulating layer 151*b*.

Figure 2:
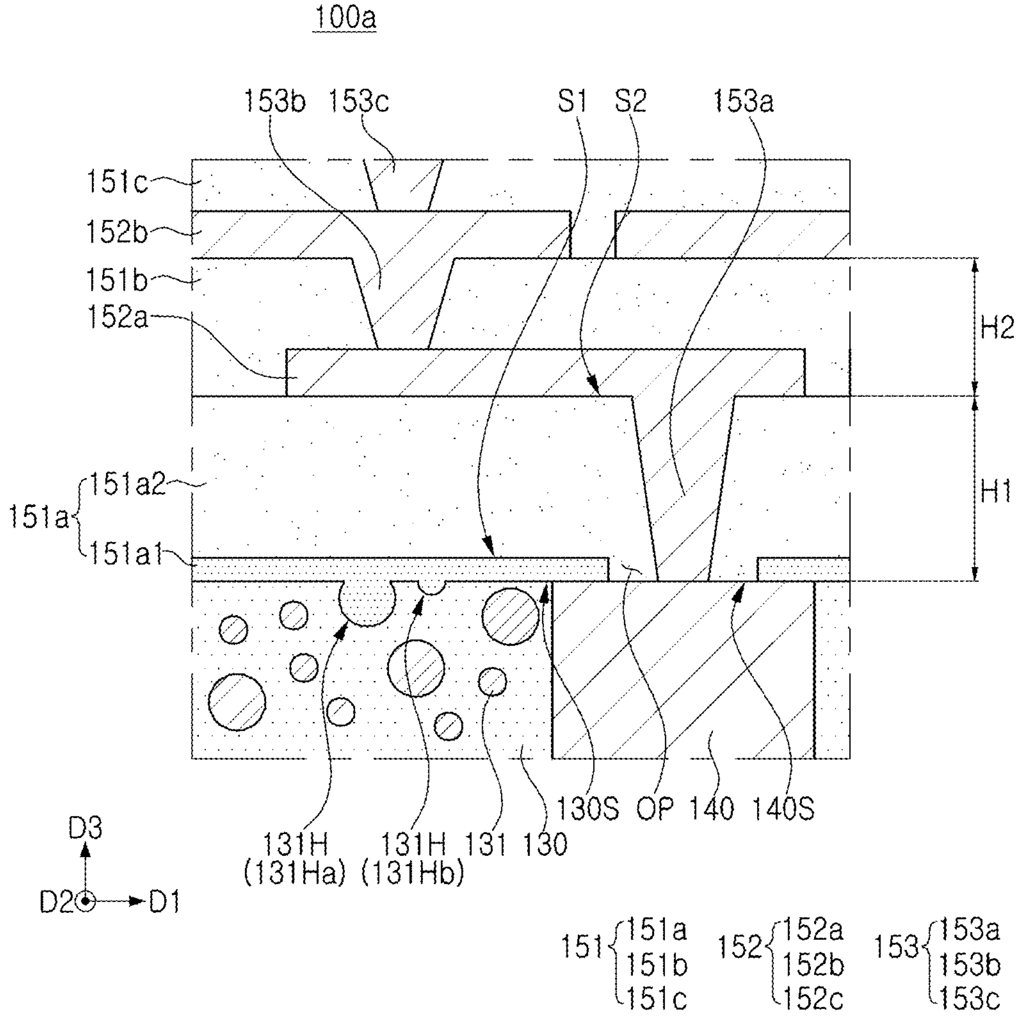
FIG. 2 is a partially enlarged view illustrating a semiconductor package of a modified example.

FIG. 2 is a partially enlarged view illustrating a semiconductor package 100*a* of a modified example.

Referring to FIG. 2, in the semiconductor package 100*a* of the modified example, the first thickness H1 of the first insulating layer 151*a* may be greater than the second thickness H2 of the second insulating layer 151*b*. The first thickness H1 of the first insulating layer 15*a*1 may be defined by the sum of the thickness of the first sub-layer 151*a*1 and the thickness of the second sub-layer 151*a*2. For example, even when the second sub-layer 151*a*2 and the second insulating layer 151*b* are formed under the same process conditions, the first thickness H1 of the first insulating layer 151*a* may be increased due to the influence of the first sub-layer 151*a*1.

Figure 3:
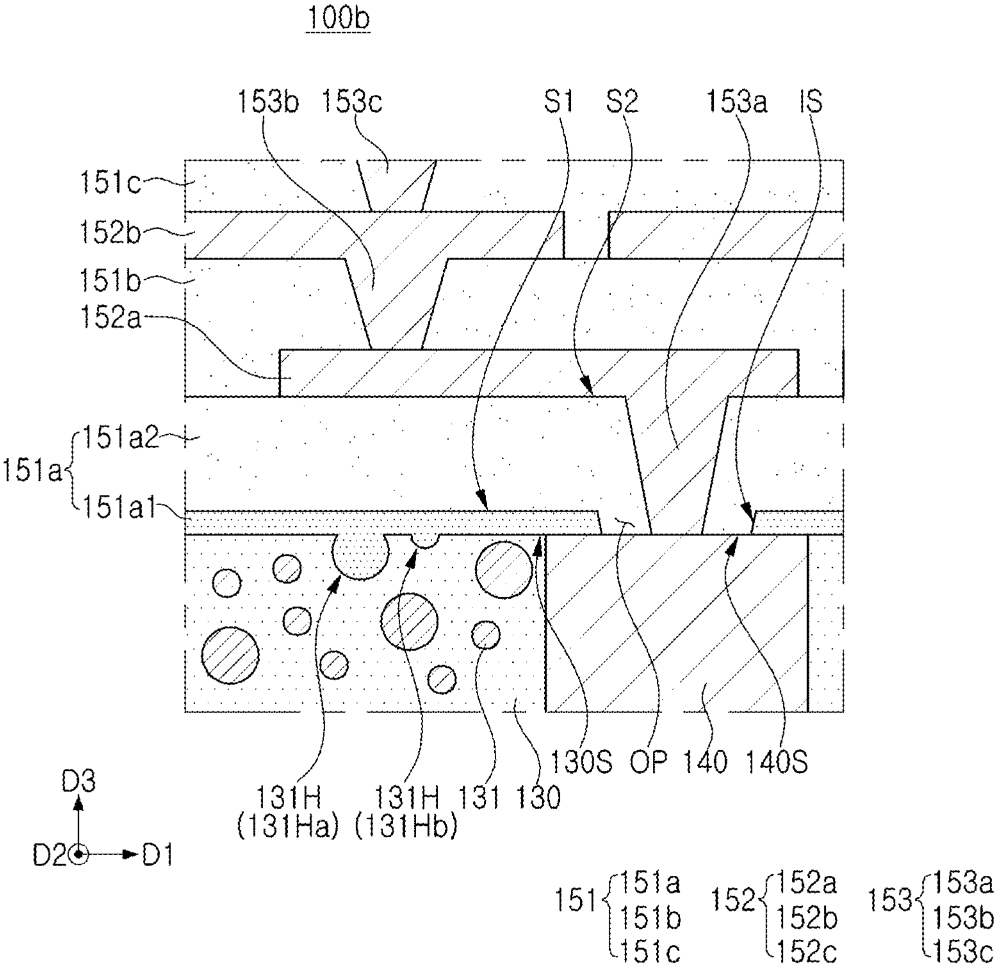
FIG. 3 is a partially enlarged view illustrating a semiconductor package of a modified example.

FIG. 3 is a partially enlarged view illustrating a semiconductor package 100*b* of a modified example.

Referring to FIG. 3, in the semiconductor package 100*b* of the modified example, the openings OP of the first sub-layer 151*a*1 may have a shape tapered in one direction. For example, the openings OP of the first sub-layer 151*a*1 may have an inner wall IS tapered toward the upper surface 130S of the molded layer 130. The inner walls IS of the openings OP may have an inclination in the same direction as that of a side surface of the lowermost upper via 153*a*, but are not limited thereto.

Figure 4A:
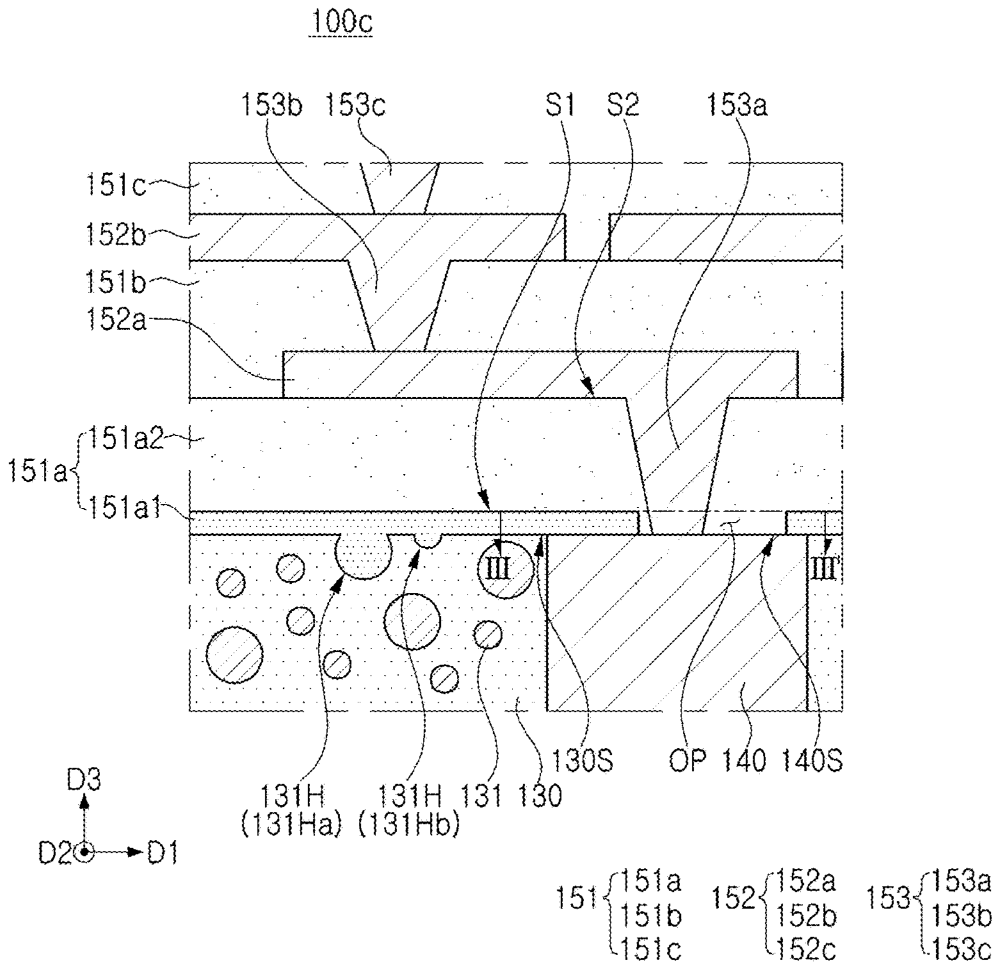
FIG. 4A is a partially enlarged view illustrating a semiconductor package of a modified example.
Figure 4B:
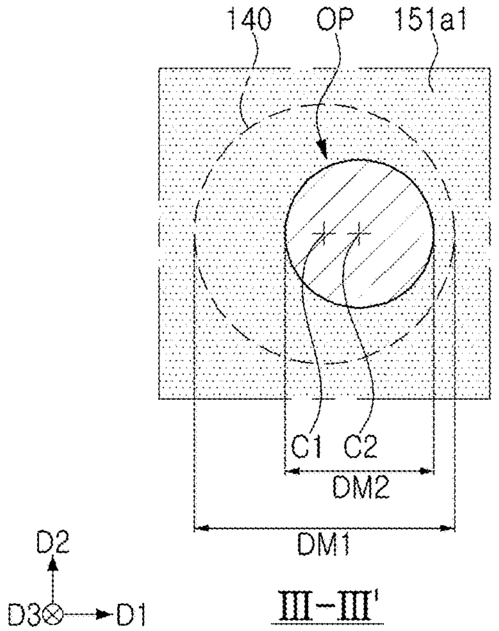
FIG. 4B is a plan view taken along line III-III' of FIG. 4A.

FIG. 4A is a partially enlarged view illustrating a semiconductor package 100*c* of a modified example, and FIG. 4B is a plan view taken along line III-III' of FIG. 4A.

Referring to FIGS. 4A and 4B, in the semiconductor package 100*c* of the modified example, the center C1 of the post 140 and the center C2 of the opening OP may not be aligned in the vertical direction D3. For example, on a plane (e.g., on a horizontal plane), the center C2 of at least some of the openings OP may be spaced apart from the center C1 of a corresponding one of the plurality of posts 140 in the horizontal direction D1. In this case, the width DM2 of each of the openings OP of the first sub-layer 151*a*1 may be about 90% or less of the width DM1 of a corresponding one of the plurality of posts 140, but is not limited thereto. According to a modified example, a portion of the molded layer (“130” in FIG. 1A) around the posts 140 may be exposed through the openings OP.

Figure 5A:
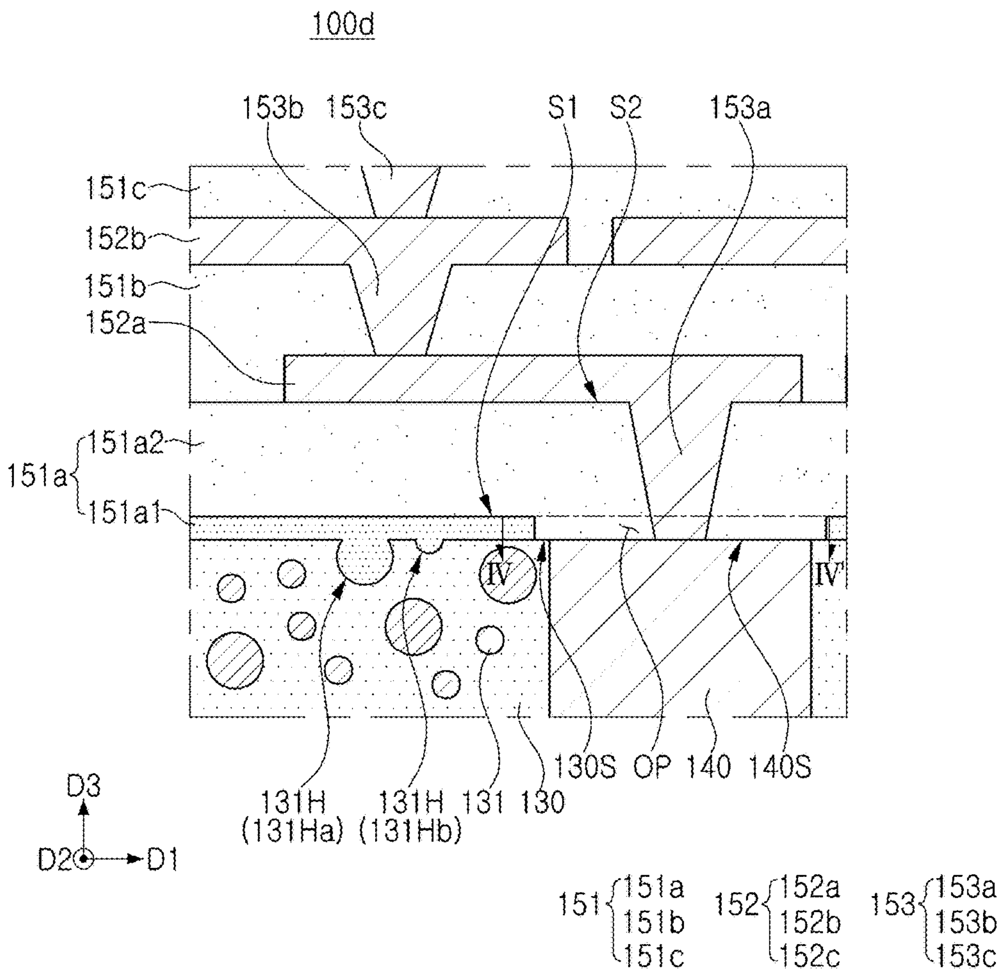
FIG. 5A is a partially enlarged view illustrating a semiconductor package of a modified example.
Figure 5B:
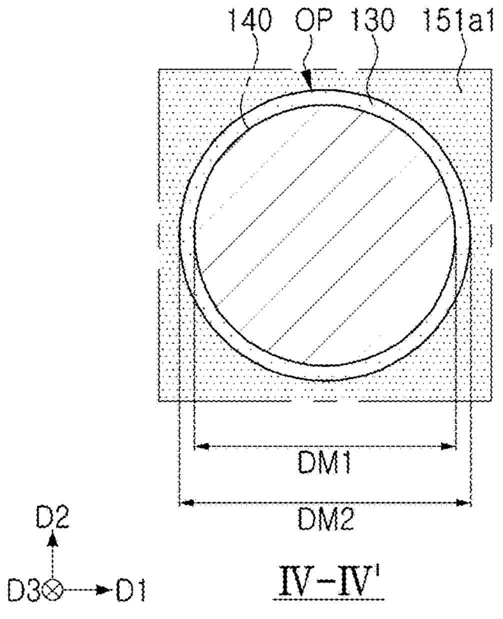
FIG. 5B is a plan view taken along line IV-IV' of FIG. 5A.

FIG. 5A is a partially enlarged view illustrating a semiconductor package 100*d* of a modified example, and FIG. 5B is a plan view taken along line IV-IV' of FIG. 5A.

Referring to FIGS. 5A and 5B, in the semiconductor package 100*d* of the modified example, the width DM2 of each of the openings OP of the first sub-layer 151*a*1 may be greater than the width DM1 of the upper surface 140S of a corresponding one of the plurality of posts 140. In this case, the molded layer 130 around the posts 140 may be partially exposed through the openings OP. That is, in some example embodiments, when the first sub-layer 151*a*1 is introduced for the purpose of filling the hollows 131H of the molded layer 130, the size of the openings OP may not be particularly limited.

Figure 6:
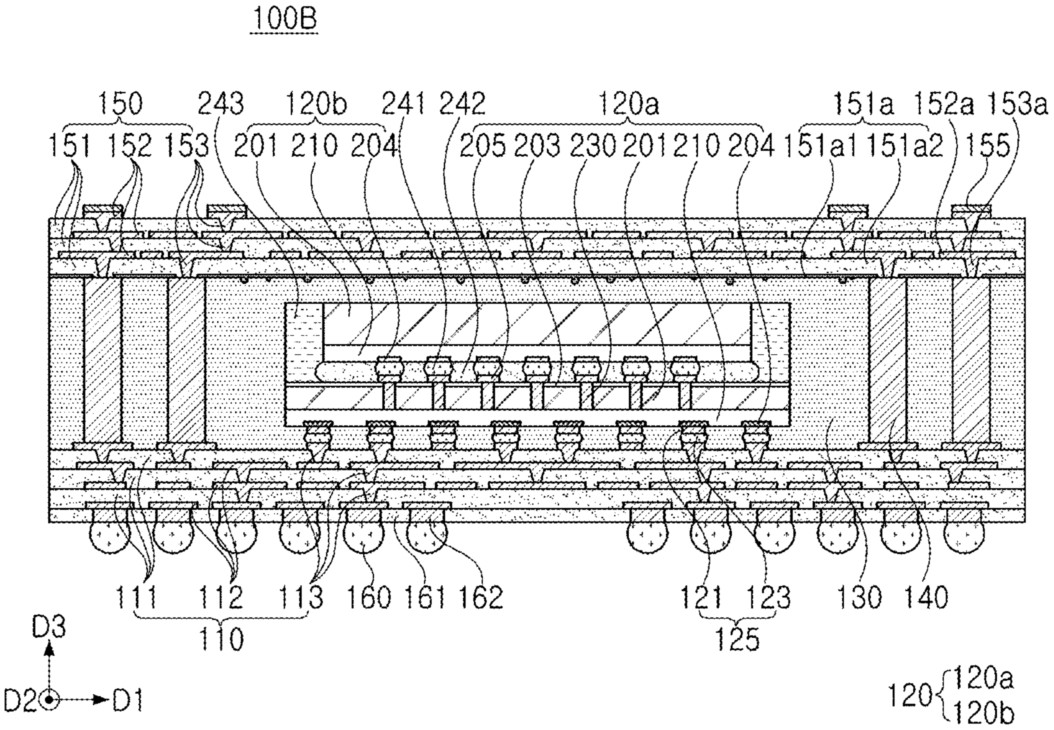
FIG. 6 is a cross-sectional view of a semiconductor package according to an embodiment.

FIG. 6 is a cross-sectional view of a semiconductor package 100B according to an embodiment.

Referring to FIG. 6, the semiconductor package 100B of an embodiment may have characteristics similar to or the same as those described above with reference to FIGS. 1A to 5B, except that the semiconductor package 100B includes a chip structure 120 in which a plurality of semiconductor chips 120*a* and 120*b* are embedded.

At least one (e.g., ‘120*a*’) of the plurality of semiconductor chips 120*a* and 120*b* may include through-vias 230 electrically connecting the plurality of semiconductor chips 120*a* and 120*b* to each other. The plurality of semiconductor chips 120*a* and 120*b* may be chiplets constituting a multichip module (MCM). The plurality of semiconductor chips 120*a* and 120*b* may include a CPU, a GPU, an FPGA, a DSP, a cryptographic processor, a microprocessor, a microcontroller, an ADC, an ASIC, a volatile memory, a nonvolatile memory, an input/output (I/O) circuit, an analog circuit, a serial-to-parallel conversion circuit, and the like.

In an embodiment, the chip structure 120 may include a base chip 120*a* and at least one stacked chip 120*b*. For example, the base chip 120*a* may include a processor circuit, and the at least one stacked chip 120*b* may include at least one of an input/output circuit for a processor circuit, an analog circuit, a memory circuit, and a serial-to-parallel conversion circuit. The base chip 120*a* and the at least one stacked chip 120*b* may be provided in larger numbers than those illustrated in the drawing. For example, the at least one stacked chip 120*b* may include two or more semiconductor chips arranged horizontally and/or vertically on the base chip 120*a*.

The base chip 120*a* and the at least one stacked chip 120*b* may include a substrate 201, an upper protective layer 203, an upper pad 205, a circuit layer 210, a lower pad 204, and/or a through-via 230. The substrate 201 may be formed of or include, for example, a semiconductor element, such as silicon or germanium (Ge) or a compound semiconductor, such as silicon carbide (SiC), gallium arsenide (GaAs), indium arsenide (InAs), or indium phosphide (InP). The substrate 201 may have a silicon-on-insulator (SOI) structure. The substrate 201 may have a conductive region, for example, a well doped with an impurity, or an active surface doped with an impurity, and an opposite inactive surface. The substrate 201 may include various device isolation structures, such as a shallow trench isolation (STI) structure.

The upper protective layer 203 may be formed on the inactive surface of the substrate 201 and may protect the substrate 201. The upper protective layer 203 may be formed of an insulating layer, such as a silicon oxide film, a silicon nitride film, or a silicon oxynitride film, but the material of the upper protective layer 203 is not limited to the above materials. Although not illustrated in the drawing, a lower protective layer may be further formed on the lower surface of the circuit layer 210.

The upper pad 205 may be disposed on the upper protective layer 203. The upper pad 205 may be formed of or include, for example, at least one of aluminum (Al), copper (Cu), nickel (Ni), tungsten (W), platinum (Pt), and gold (Au). The lower pad 204 may be disposed below the circuit layer 210 and may include a material similar to that of the upper pad 205. However, the materials of the upper pad 205 and lower pad 204 are not limited to the above materials. The lower pad 204 of the base chip 120*a* may be understood as corresponding to the connection terminals 120P described above.

The circuit layer 210 may be disposed on the active surface of the substrate 201 and may include various types of devices. For example, the circuit layer 210 may include field effect transistors (FETs), such as a planar FET or FinFET, memory devices, such as flash memory, dynamic random access memory (DRAM), static random access memory (SRAM), electrically erasable programmable read-only memory (EEPROM), phase-change random access memory (PRAM), magnetoresistive random access memory (MRAM), ferroelectric random access memory (FeRAM), and resistive random access memory (RRAM), logic devices, such as AND, OR, NOT, various active devices and/or passive devices, such as system large scale integration (LSI), CMOS imaging sensor (CIS), and micro-electro-mechanical system (MEMS). The circuit layer 210 may include an interconnection structure electrically connected to the aforementioned elements and an interlayer insulating layer surrounding the interconnection structure. The interlayer insulating layer may include silicon oxide or silicon nitride. The interconnection structure may include multilayer interconnections and/or vertical contacts. The interconnection structure may connect elements of the circuit layer 210 to each other, connect the elements to conductive regions of the substrate 201, or connect the elements to the through-via 230.

The base chip 120*a* is disposed below the at least one stacked chip 120*b* and may include the through-vias 230 electrically connected to the at least one stacked chip 120*b*. The through-via 230 may penetrate through the substrate 201 in the vertical direction D3 and may provide an electrical path connecting the upper pad 205 to the lower pads 204. The through-via 230 may include a conductive plug and a barrier film surrounding the conductive plug. The conductive plug may be formed of or include a metal, such as tungsten (W), titanium (Ti), aluminum (Al), or copper (Cu). The conductive plug may be formed by a plating process, a PVD process, or a CVD process. The barrier film may be formed of or include an insulating barrier film and/or a conductive barrier film. The insulating barrier film may be formed of an oxide film, a nitride film, a carbonization film, a polymer, or combinations thereof. The conductive barrier film may be disposed between the insulating barrier film and the conductive plug. The conductive barrier film may be formed of or include a metal compound, such as tungsten nitride (WN), titanium nitride (TiN), or tantalum nitride (TaN), for example. The barrier film may be formed by a PVD process or a CVD process.

The base chip 120*a* and the at least one stacked chip 120*b* may be electrically connected through bumps 241. The bumps 241 may be disposed in an adhesive layer 242 between the base chip 120*a* and the at least one stacked chip 120*b*. The bumps 241 may be formed of or include tin (Sn), indium (In), bismuth (Bi), antimony (Sb), copper (Cu), silver (Ag), zinc (Zn), lead (Pb) and/or alloys thereof, and according to an embodiment, the bumps 241 may have a form in which a metal pillar and a solder ball are combined. The adhesive layer 242 may surround each of the bumps 241 and may bond the base chip 120*a* and the at least one stacked chip 120*b*. The adhesive layer 242 may be formed using a non-conductive film (NCF), but is not limited thereto. For example, the adhesive layer 242 may be formed using any type of insulating film susceptible to a heat compression process. According to an embodiment, the base chip 120*a* and the at least one stacked chip 120*b* may be connected by directly bonding and coupling the corresponding upper pad 205 and lower pad 204 without bumps 241.

The at least one stacked chip 120*b* may be sealed by a mold 243. The mold 243 may surround outer surfaces of the at least one stacked chip 120*b* and the adhesive layer 242 on the base chip 120*a*. The mold 243 may be formed of or include a thermosetting resin, such as epoxy resin, a thermoplastic resin, such as polyimide, or prepreg, ABF, FR-4, BT, EMC, etc.

Figure 7:
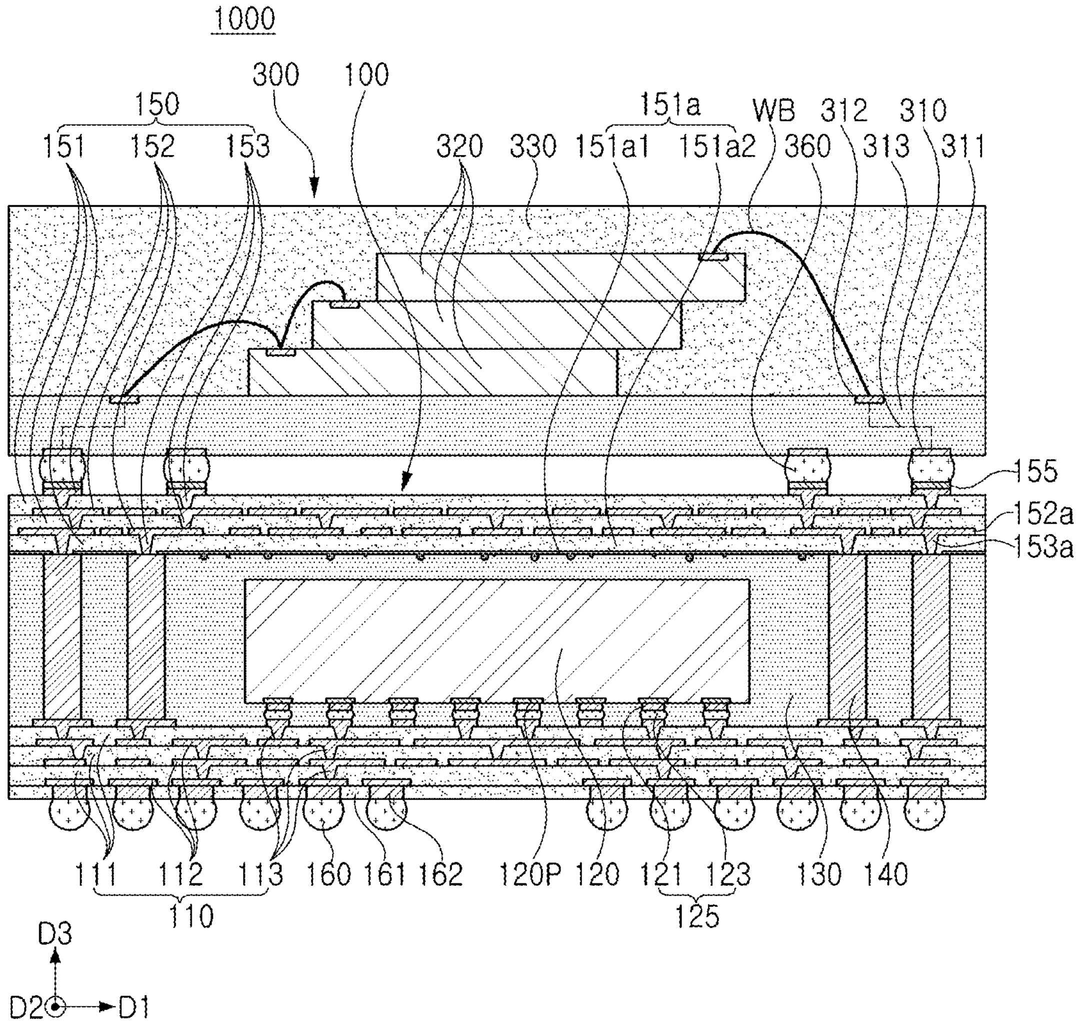
FIG. 7 is a cross-sectional view of a semiconductor package according to an embodiment.

FIG. 7 is a cross-sectional view of a semiconductor package 1000 according to an embodiment.

Referring to FIG. 7, the semiconductor package 1000 according to an embodiment may include a lower package 100 and an upper package 300. The lower package 100 is illustrated to be the same as the semiconductor package 100A illustrated in FIG. 1A, but may be replaced with the semiconductor packages 100*a*, 100*b*, 100*c*, 100*d*, and 100B described above with reference to FIGS. 2 to 6 or semiconductor packages having similar characteristics as those of the semiconductor packages 100*a*, 100*b*, 100*c*, 100*d*, and 100B. The semiconductor package 1000 of the present embodiment may include a lower package 100 into which the lowermost upper insulating layer 151*a* including the first sub-layer 151*a*1 and the second sub-layer 151*a*2 is introduced, and may implement a package-on-package structure having improved reliability and yield.

The upper package 300 may include a redistribution substrate 310, a semiconductor chip 320, and an encapsulant 330. The redistribution substrate 310 may include a lower pad 311 and an upper pad 312. In addition, the redistribution substrate 310 may include a redistribution circuit 313 electrically connecting the lower pad 311 to the upper pad 312. The redistribution substrate 310 may be a substrate for a semiconductor package including a printed circuit board (PCB), a ceramic board, a glass substrate, a tape wiring board, and the like. For example, the redistribution substrate 310 may be a double-sided PCB or a multilayer PCB.

The semiconductor chip 320 may be mounted on the redistribution substrate 310 using a wire bonding or flip chip bonding method. For example, the plurality of semiconductor chips 320 may be stacked in a vertical direction on the redistribution substrate 310 and electrically connected to the upper pad 312 of the redistribution substrate 310 by a bonding wire WB. In an example, the semiconductor chip 320 of the upper package 300 may include a memory chip, and the chip structure 120 of the lower package 100 may include an AP chip.

The encapsulant 330 may be formed of or include a material the same as or similar to that of the molded layer 130 of the lower package 100. The upper package 300 may be physically and electrically connected to the lower package 100 by a conductive bump 360. The conductive bump 360 may be formed of or include a low melting point metal, for example, tin (Sn) or an alloy containing tin (Sn).

FIGS. 8A to 8G are views illustrating a manufacturing process of a semiconductor package according to an embodiment.

Figure 8A:
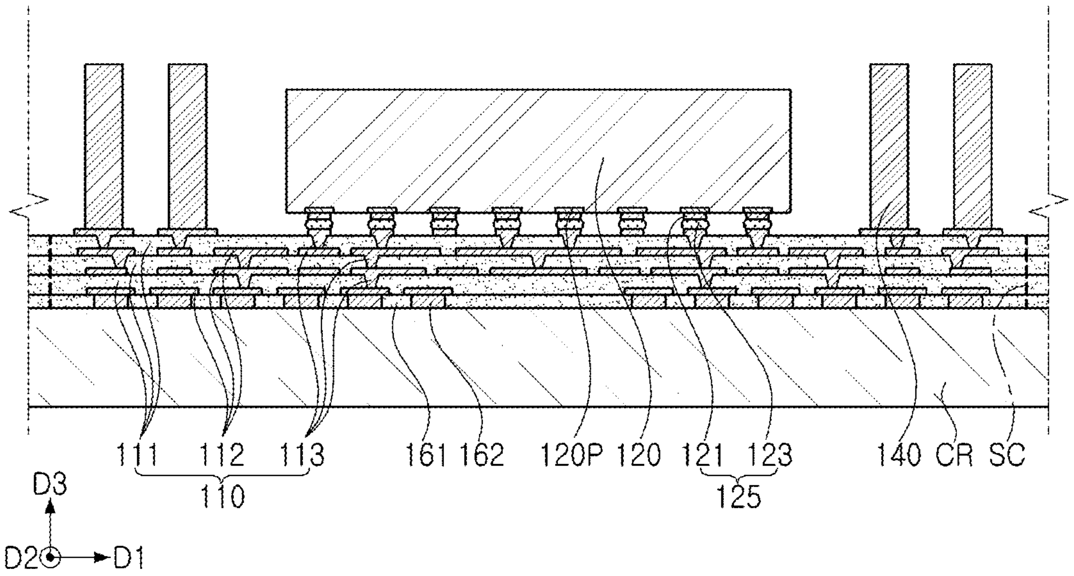
FIGS. 8A to 8G are views illustrating a manufacturing process of a semiconductor package according to an embodiment.

Referring to FIG. 8A, the chip structure 120 may be mounted on the lower redistribution structure 110. The lower redistribution structure 110 may be formed on the carrier substrate CR. The carrier substrate CR may be a temporary support, such as a glass wafer. The lower redistribution structure 110 may be formed on a wafer level. A plurality of lower redistribution structures 110 divided by scribe lanes SC may be formed on the carrier substrate CR. The lower redistribution structure 110 may include a lower insulating layer 111, a lower redistribution layer 112, and a lower redistribution via 113. The lower insulating layer 111 may be formed by sequentially applying and curing a photosensitive material, for example, PID. The lower redistribution layer 112 and the lower redistribution via 113 may be formed by forming a via hole penetrating through the lower insulating layer 111 by performing an exposure process and a development process and patterning a metal material on the lower insulating layer 111 using a plating process. A plurality of posts 140 may be formed on the lower redistribution layer 112 by performing a plating process.

Figure 8B:
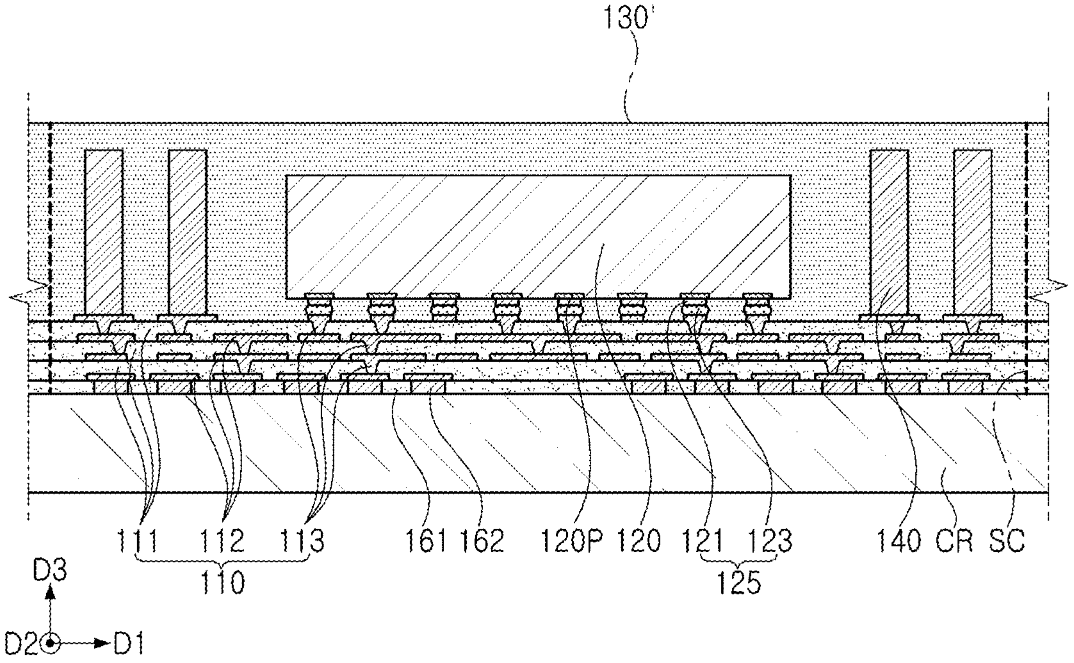

Referring to FIG. 8B, a preliminary molded layer 130' covering the chip structure 120 and the plurality of posts 140 may be formed. The preliminary molded layer 130' may be formed to entirely cover the top of the chip structure 120 and the plurality of posts 140. The preliminary molded layer 130' may be formed, for example, by applying and curing EMC.

Figure 8C:
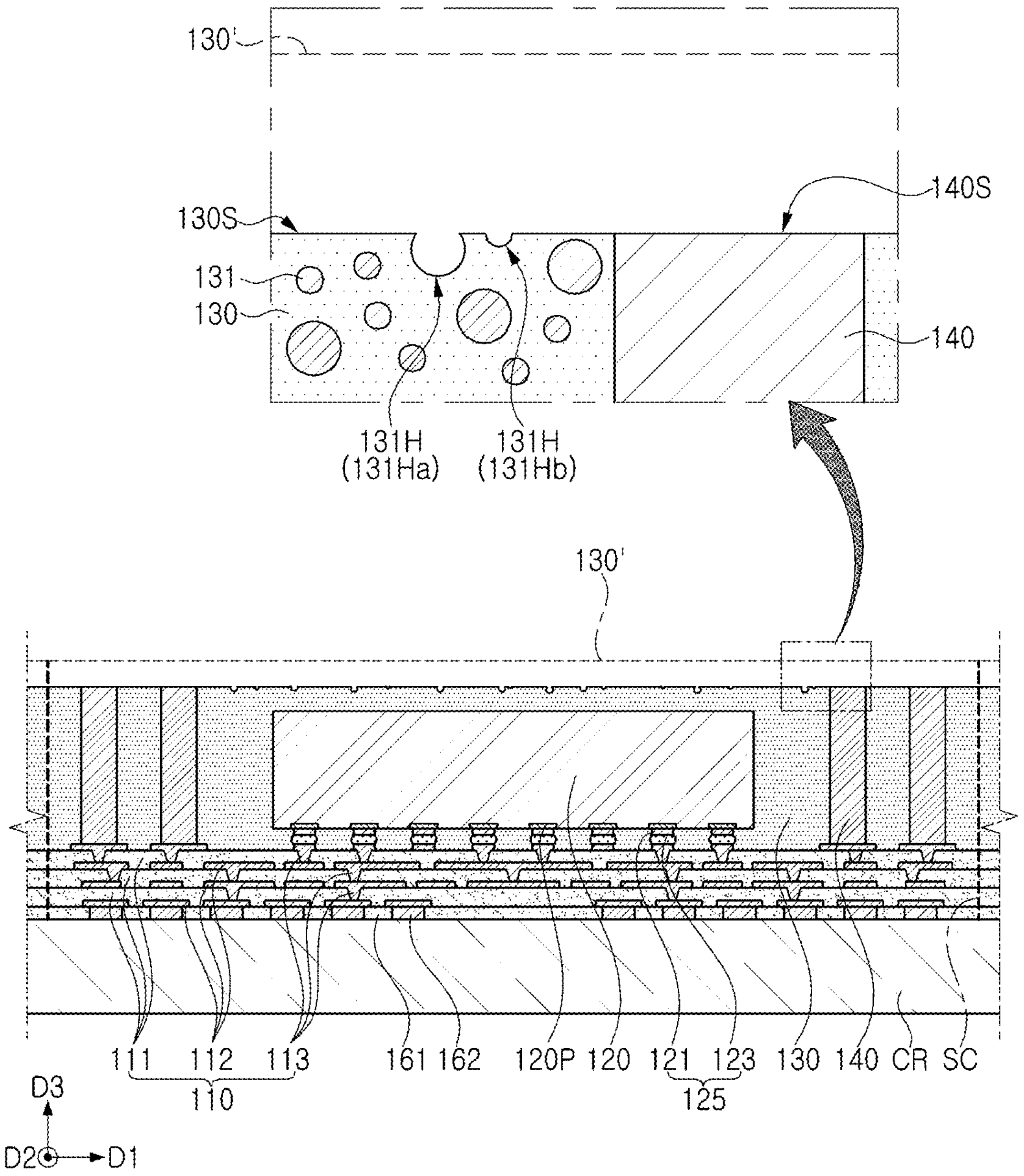

Referring to FIG. 8C, a planarization process may be applied to an upper portion of the preliminary molded layer 130'. The planarization process may include, for example, a grinding process. The molded layer 130 may be formed with a portion of the preliminary molded layer 130' removed through the planarization process. The molded layer 130 may be formed so that the upper surface 140S of the plurality of posts 140 is exposed from the upper surface 130S of the molded layer 130. The hollows 131H from which the fillers 131 are removed may be formed on the upper surface 130S of the molded layer 130.

Figure 8D:
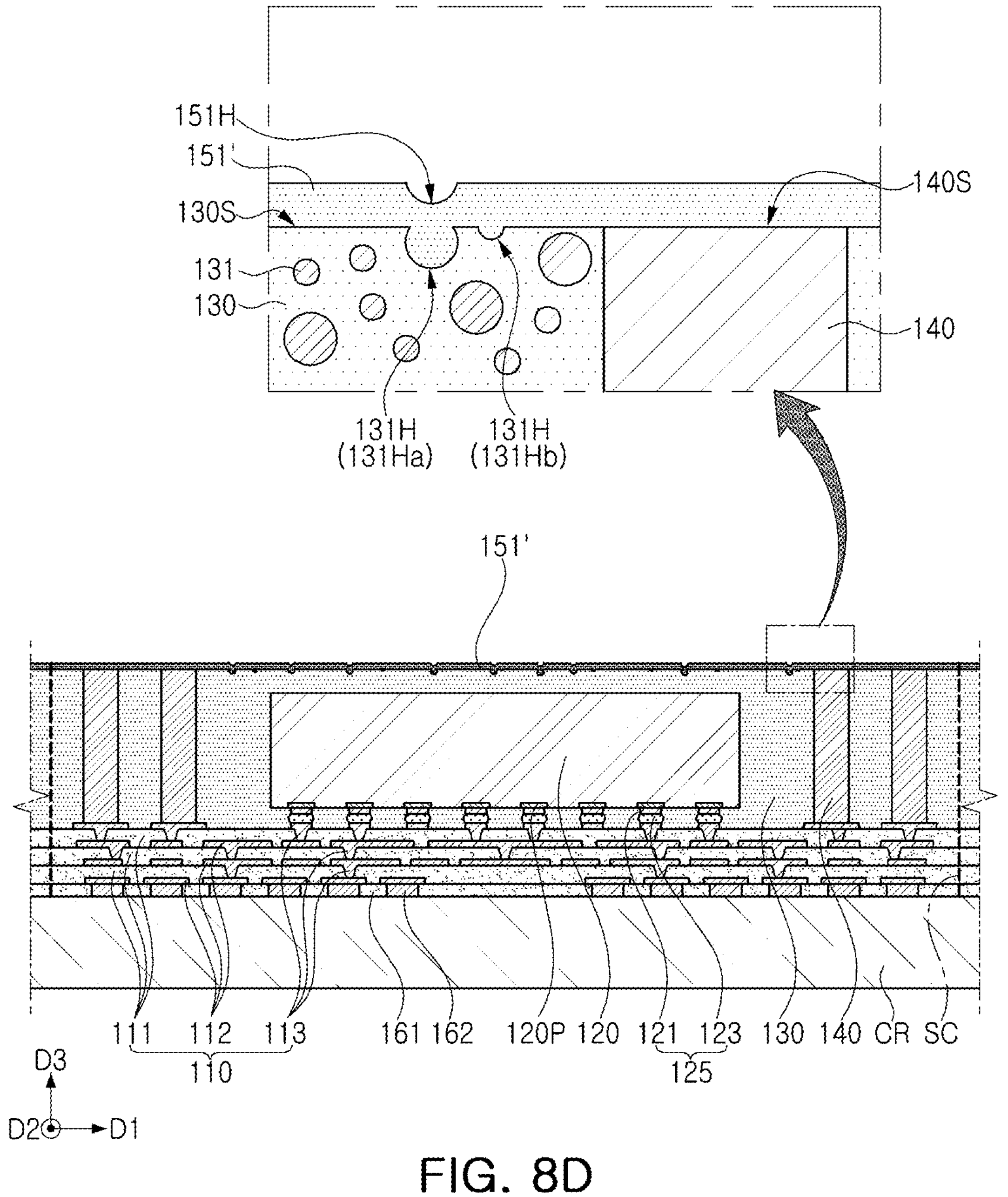

Referring to FIG. 8D, a preliminary sub-layer 151' may be formed on the upper surface 130S of the molded layer 130 and the upper surface 140S of the posts 140. The preliminary sub-layer 151' may be formed by applying a photosensitive resin (e.g., spin coating). The preliminary sub-layer 151' may be formed conformally on the upper surface 130S of the molded layer 130 and the upper surface 140S of the posts 140. Accordingly, the preliminary sub-layer 151' may include a recess 151H corresponding to at least some hollows (e.g., '131Ha') among the plurality of hollows 131H.

Figure 8E:
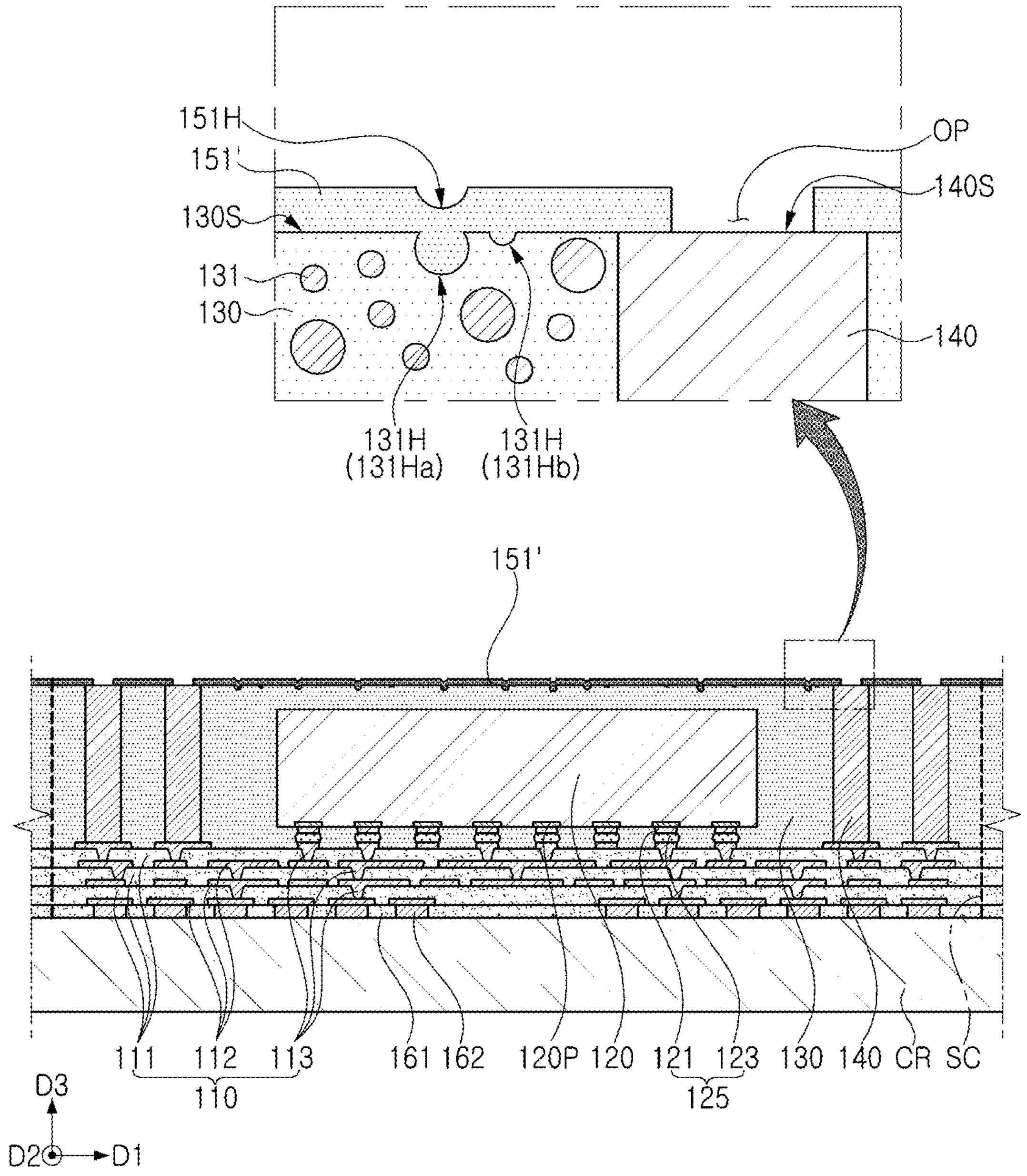

Referring to FIG. 8E, openings OP may be formed in the preliminary sub-layer 151'. The openings OP may be formed by removing a portion of the preliminary sub-layer 151'. A portion of the preliminary sub-layer 151' may be removed by performing an exposure process and a development process. The openings OP may be formed to have a width smaller than the width of the upper surface 140S of the corresponding post 140, but are not limited thereto.

Figure 8F:
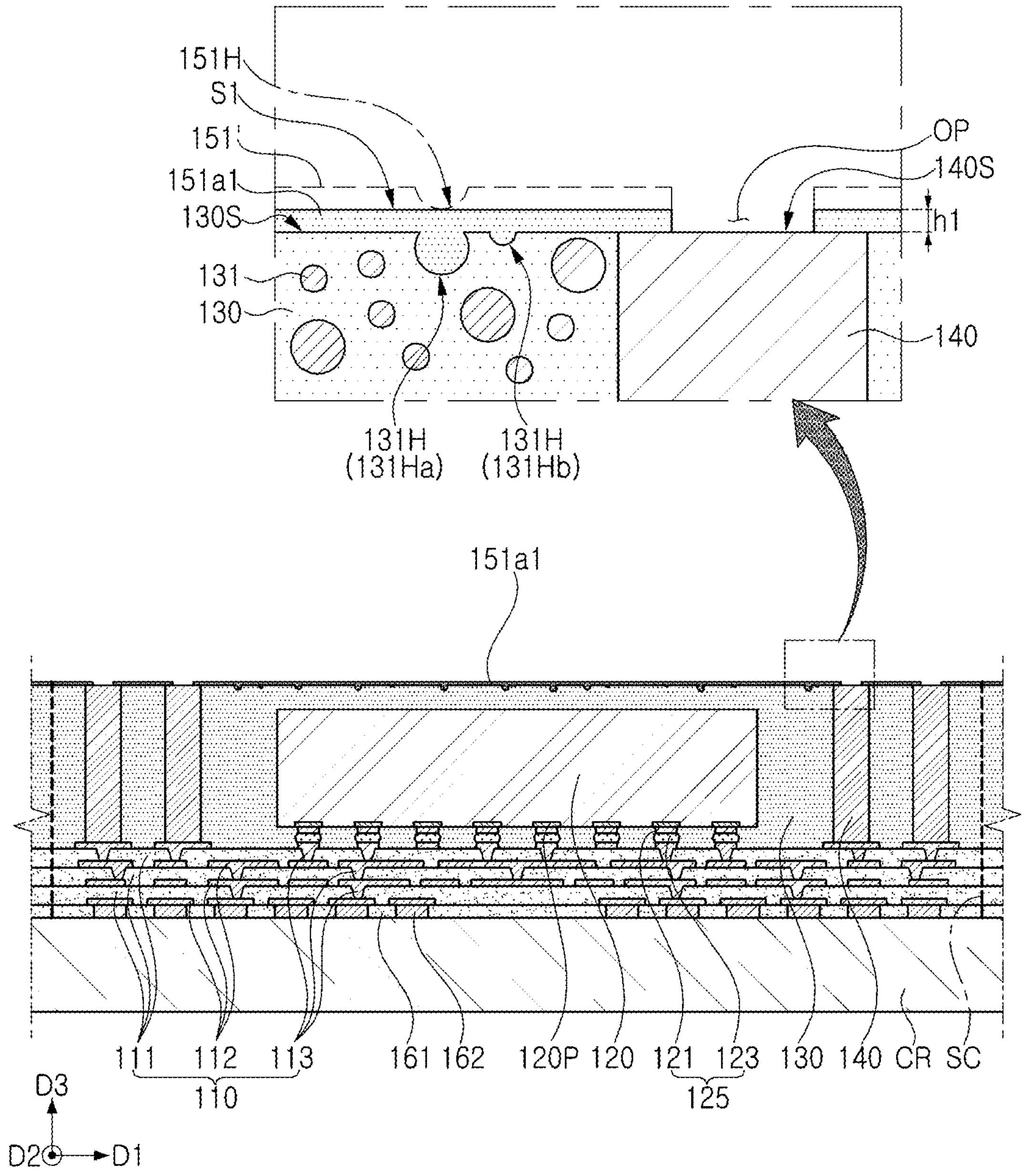

Referring to FIG. 8F, the first sub-layer 151*a*1 may be formed from which the recesses 151H were removed. The first sub-layer 151*a*1 may be formed by cutting the preliminary sub-layer 151' in the horizontal direction before curing. A portion of the preliminary sub-layer 151' including the recesses 151H may be removed by a surface cutting process using a cutting tool (e.g., blade). The first sub-layer 151*a*1 may have a flat upper surface S1 from which the recesses 151H were removed. That is, the first height h1 may be determined according to the size of the recesses 151H of the preliminary sub-layer 151'.

Figure 8G:
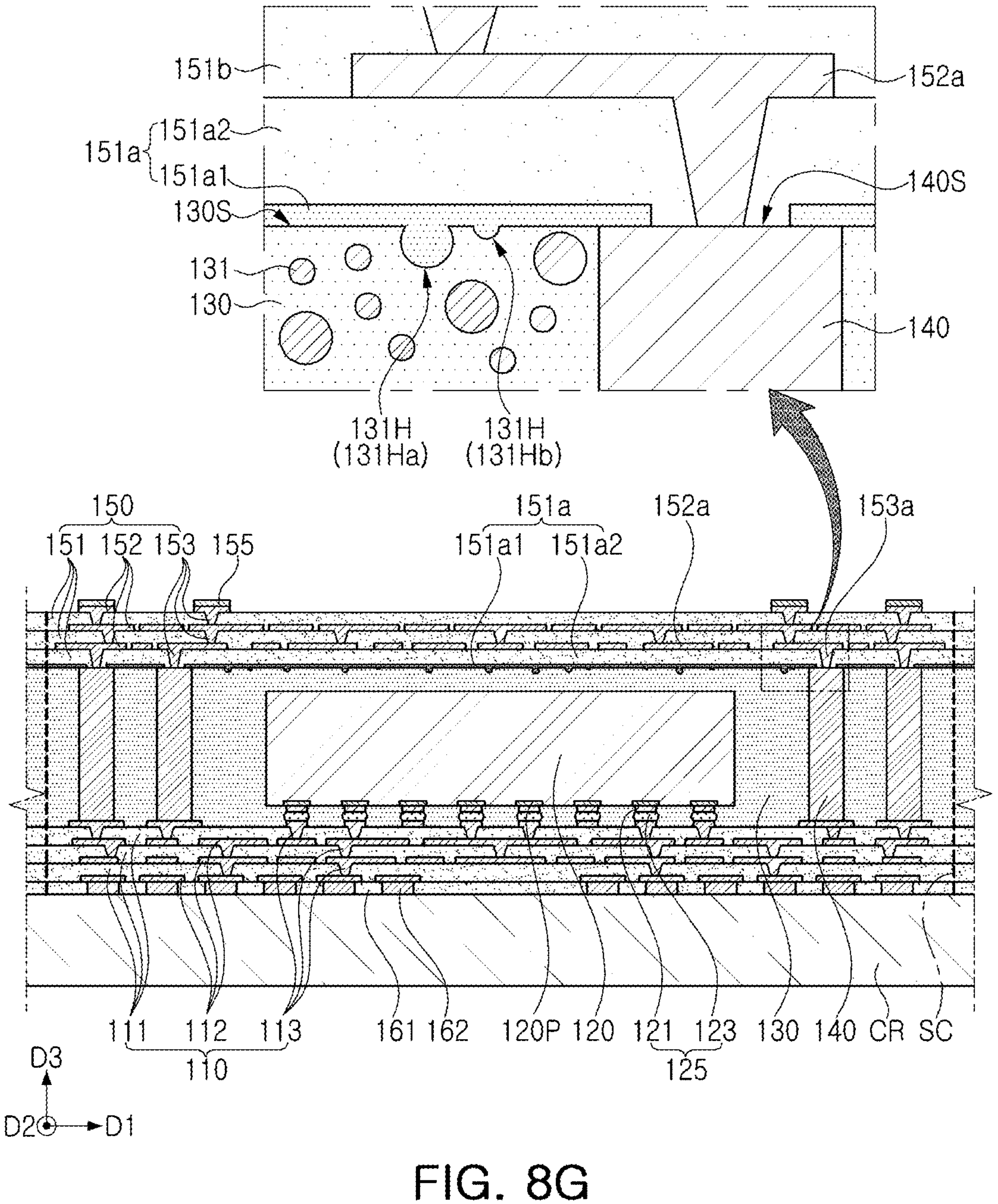

Referring to FIG. 8G, the upper redistribution structure 150 may be formed. The upper redistribution structure 150 may include a plurality of upper insulating layers 151, a plurality of upper redistribution layers 152, and a plurality of upper redistribution vias 153. The upper redistribution structure 150 may be formed by repeating a process similar to that of the lower redistribution structure 110 described above. The lowest insulating layer 151*a* among the plurality of upper insulating layers 151 may include the first sub-layer 151*a*1 and the second sub-layer 151*a*2. The first sub-layer 151*a*1 and the second sub-layer 151*a*2 may include the same photosensitive resin. The first sub-layer 151*a*1 may prevent defects caused by the hollows 131H of the molded layer 130 and improve the reliability of the semiconductor package. Thereafter, unit packages may be separated by performing a cutting process along the scribe lane SC.

The second sub-layer 151*a*2 may be formed by the same process (e.g., spin coating) as the first sub-layer 151*a*1 or by a different process. The second sub-layer 151*a*2 may be formed of the same material as the first sub-layer 151*a*1 or may be formed of a different material. The boundary between the first sub-layer 151*a*1 and the second sub-layer 151*a*2 may be apparent or non-apparent depending on the processes used to form the first sub-layer 151*a*1 and the second sub-layer 151*a*2. For example, the first sub-layer 151*a*1 may be continuously integrated with the second sub-layer 151*a*2.

As used herein, a "continuously integrated structure" refers to a structure to be continuously integrated, without a discontinuous boundary surface (for example, a grain boundary), in which two components formed by a different process are not simply in contact (discontinuity), but are formed of the same material by the same process.

Figure 9:
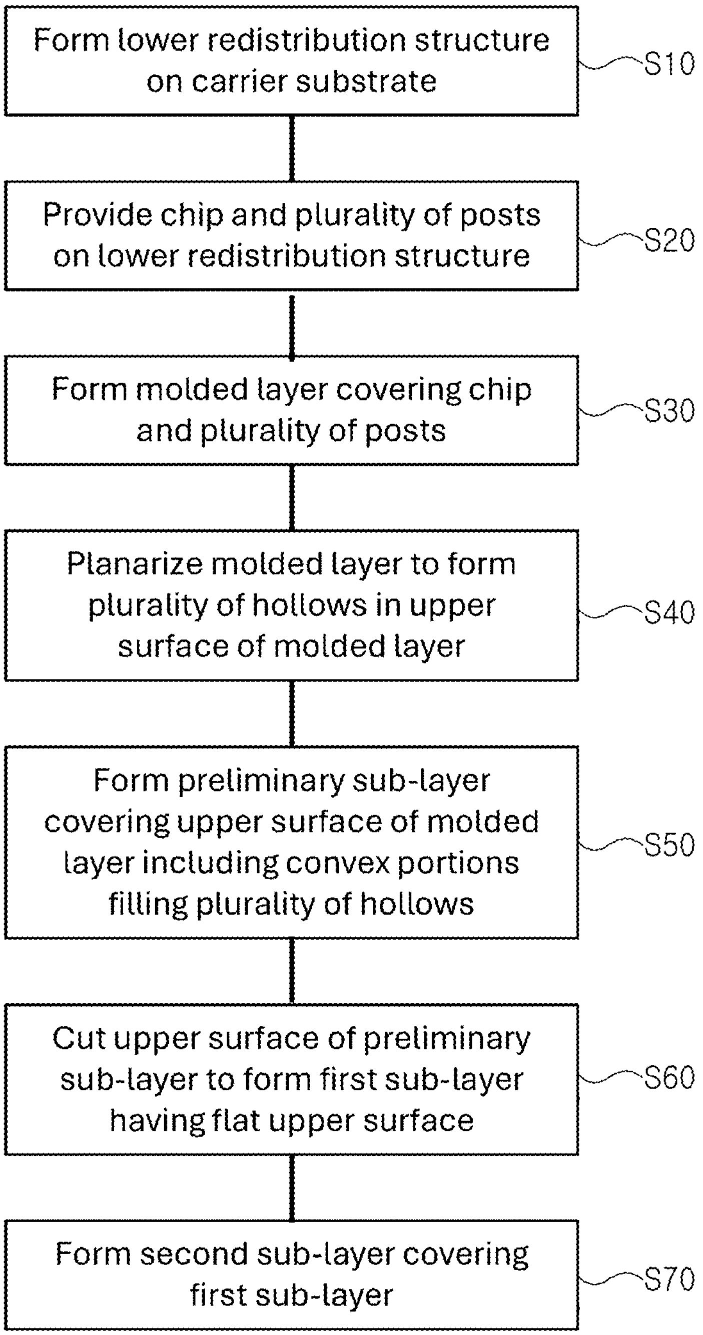
FIG. 9 is a flowchart showing steps of a method of manufacturing a semiconductor package according to an embodiment.

FIG. 9 is a flowchart showing steps of a method of manufacturing a semiconductor package according to an embodiment.

With reference to FIG. 9, at step S10, a lower redistribution structure 110 is formed on a carrier substrate CR.

At step S20, a chip 120 and a plurality of conductive posts 140 are provided on the lower redistribution structure 110.

At step S30, a molded layer 130 is formed covering the chip 120 and the plurality of posts 140.

At step S40, the molded layer 130 is planarized to expose upper surfaces of the plurality of posts 140. The planarization process also causes a plurality of hollows 131H to form in the upper surface of the molded layer 130.

At step S50, a preliminary sub-layer 151' is formed covering the upper surface of the molded layer 130 and upper surfaces of each of the plurality of posts 140. The preliminary sub-layer 151' includes protruding portions filling the plurality of hollows 131H.

At step S60, the upper surface of the preliminary sub-layer 151' is cut to form first sub-layer 151*a*1 having a flat upper surface.

At step S70, a second sub-layer 151*a*2 is formed covering the first sub-layer 151*a*1.

According to example embodiments of the present inventive concept, the semiconductor package having improved reliability may be provided by introducing a hollow filling layer on the upper surface of the molded layer to which back grinding is applied.

While example embodiments have been illustrated and described above, it will be apparent to those skilled in the art that modifications and variations could be made without departing from the scope of the present inventive concept as defined by the appended claims.

What is claimed is:

1. A semiconductor package comprising:

a lower redistribution structure including a lower redistribution layer;

a chip on the lower redistribution structure;

a molded layer covering at least a portion of the chip, the molded layer including a plurality of hollows in an upper surface thereof;

an upper redistribution structure on the molded layer and including a plurality of insulating layers and a plurality of upper redistribution layers respectively disposed on the plurality of insulating layers;

a plurality of posts penetrating through the molded layer and electrically connecting the lower redistribution layer to the plurality of upper redistribution layers; and external connection bumps below the lower redistribution structure and electrically connected to the lower redistribution layer, wherein the plurality of upper redistribution layers include a first upper redistribution layer closest to the upper surface of the molded layer, the plurality of insulating layers include a first insulating layer between the first upper redistribution layer and the molded layer, the first insulating layer includes:

a first sub-layer covering the upper surface of the molded layer and an upper surface of each of the plurality of posts, the first sub-layer including protruding portions filling the plurality of hollows and openings exposing at least a portion of the upper surface of each of the plurality of posts, and a second sub-layer covering the first sub-layer and filling the openings, and wherein a first height from the upper surface of the molded layer to an upper surface of the first sub-layer is less than a second height from the upper surface of the first sub-layer to an upper surface of the second sub-layer.

2. The semiconductor package of claim 1, wherein the first height is in a range from about 15% to about 35% of the second height.

3. The semiconductor package of claim 2, wherein the second height is in a range from about 2 μm to about 8 μm.

4. The semiconductor package of claim 1, wherein at least one of the plurality of hollows has at least one of a depth and a width of about 10 μm or more, the depth being perpendicular to the upper surface of the molded layer and the width being parallel to the upper surface of the molded layer.

5. The semiconductor package of claim 1, wherein:

the upper redistribution structure further includes a plurality of upper vias penetrating through each of the plurality of insulating layers and electrically connected to the plurality of upper redistribution layers, and the plurality of upper vias include a first upper via penetrating through the second sub-layer, the first upper via being connected to the upper surface of a corresponding one of the plurality of posts through a corresponding opening of the first sub-layer.

6. The semiconductor package of claim 1, wherein a width of each of the openings of the first sub-layer is about 70% to about 90% of a width of the upper surface of a corresponding one of the plurality of posts.

7. The semiconductor package of claim 6, wherein a center of at least one of the openings is spaced apart from a center of a corresponding one of the plurality of posts in a horizontal direction.

8. The semiconductor package of claim 1, wherein:

the plurality of insulating layers further include a second insulating layer covering the first upper redistribution layer, and the plurality of upper redistribution layers further include a second upper redistribution layer on an upper surface of the second insulating layer.

9. The semiconductor package of claim 8, wherein a first thickness of the first insulating layer from the upper surface of the molded layer to the upper surface of the second sub-layer is greater than a second thickness of the second insulating layer from the upper surface of the second sub-layer to the upper surface of the second insulating layer.

10. The semiconductor package of claim 8, wherein a first thickness of the first insulating layer from the upper surface of the molded layer to the upper surface of the second sub-layer is equal to or less than a second thickness of the second insulating layer from the upper surface of the second sub-layer to the upper surface of the second insulating layer.

11. The semiconductor package of claim 1, wherein the openings of the first sub-layer have inner walls tapered toward the upper surface of the molded layer.

12. The semiconductor package of claim 1, wherein the upper surface of the molded layer and the upper surface of each of the plurality of posts are coplanar.

13. The semiconductor package of claim 1, wherein the first sub-layer and the second sub-layer include a photosensitive material.

14. The semiconductor package of claim 1, wherein the chip includes at least one stacked chip and a base chip disposed below the at least one stacked chip, the base chip including through-vias electrically connected to the at least one stacked chip and connection terminals electrically connected to the lower redistribution layer.

15. A semiconductor package comprising:

a lower redistribution structure including a lower redistribution layer;

a chip on the lower redistribution structure;

a molded layer covering at least a portion of the chip, the molded layer including a plurality of hollows in an upper surface thereof;

an upper redistribution structure on the molded layer and including a plurality of insulating layers and a plurality of upper redistribution layers respectively disposed on the plurality of insulating layers; and a plurality of posts penetrating through the molded layer and electrically connecting the lower redistribution layer to the plurality of upper redistribution layers, wherein a lowest insulating layer among the plurality of insulating layers includes:

a first sub-layer filling the plurality of hollows and including openings exposing at least a portion of each of the plurality of posts, and a second sub-layer filling the openings and a space between a lowermost upper redistribution layer among the plurality of upper redistribution layers and the first sub-layer.

16. The semiconductor package of claim 15, wherein the first sub layer and the second sub-layer include the same insulating material.

17. The semiconductor package of claim 15, wherein a minimum thickness of the first sub-layer is less than a minimum thickness of the second sub-layer.

18. A semiconductor package comprising:

a lower redistribution structure including a lower redistribution layer;

a chip on the lower redistribution structure;

a molded layer covering at least a portion of the chip, the molded layer including a plurality of hollows in an upper surface thereof;

an upper redistribution structure on the molded layer and including a plurality of insulating layers and a plurality of upper redistribution layers respectively disposed on the plurality of insulating layers; and a plurality of posts penetrating through the molded layer and electrically connecting the lower redistribution layer to the plurality of upper redistribution layers, wherein a lowest insulating layer among the plurality of insulating layers includes:

a first sub-layer having a lower surface in contact with the upper surface of the molded layer and on which protruding portions filling the plurality of hollows are arranged and an upper surface opposite to the lower surface, the upper surface being flat; and a second sub-layer having a lower surface in contact with the upper surface of the first sub-layer and an upper surface on which a lowermost upper redistribution layer among the plurality of upper redistribution layers is disposed.

19. The semiconductor package of claim 18, wherein:

the first sub-layer includes openings exposing at least a portion of each of the plurality of posts, and at least a portion of the second sub-layer fills the openings.

20. The semiconductor package of claim 19, wherein the upper redistribution structure further includes a lowermost upper via penetrating through the at least a portion of the second sub-layer and electrically connecting the lowermost upper redistribution layer to a corresponding one of the plurality of posts.

* * * * *